(12) United States Patent
Schmaus et al.

(10) Patent No.: US 10,162,009 B2
(45) Date of Patent: Dec. 25, 2018

(54) METHOD FOR DETERMINING A FAULT IN AN ELECTRONICALLY COMMUTATED ELECTRIC MOTOR

(71) Applicant: Schaeffler Technologies AG & Co. KG, Herzogenaurach (DE)

(72) Inventors: Stefan Schmaus, Karlsruhe (DE); Markus Dietrich, Oberkirch (DE); Martin Zimmermann, Sasbach (DE); Francis Moebs, La Wantzenau (FR)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 0 days.

(21) Appl. No.: 14/909,534

(22) PCT Filed: Aug. 1, 2014

(86) PCT No.: PCT/DE2014/200370
§ 371 (c)(1),
(2) Date: Feb. 2, 2016

(87) PCT Pub. No.: WO2015/014362
PCT Pub. Date: Feb. 5, 2015

(65) Prior Publication Data
US 2016/0178699 A1    Jun. 23, 2016

(30) Foreign Application Priority Data
Aug. 2, 2013    (DE) .......... 10 2013 215 192

(51) Int. Cl.
*G01R 31/34*    (2006.01)
(52) U.S. Cl.
CPC .......... *G01R 31/343* (2013.01); *G01R 31/34* (2013.01)

(58) Field of Classification Search
CPC .... G01R 31/34; G01R 31/343; G01R 31/346; G01R 31/40; G01R 31/42; H02K 16/00–16/04
See application file for complete search history.

(56) References Cited

U.S. PATENT DOCUMENTS 5,057,962 A * 10/1991 Alley .................... H02H 6/005
                                                        318/783
5,574,346 A * 11/1996 Chavan .................. G01R 31/34
                                                        318/434
(Continued)

FOREIGN PATENT DOCUMENTS

DE         102011083217      3/2012
JP           2011012999      1/2011
(Continued)

*Primary Examiner* — Huy Q Phan
*Assistant Examiner* — David Frederiksen
(74) *Attorney, Agent, or Firm* — Volpe and Koenig, P.C.

(57) ABSTRACT

The invention relates to a method for determining a fault in an electronically commutated electric motor, in which at least one stator coil of the electric motor is connected in parallel in each motor phase, in which a motor phase is energized and the current flowing through this motor phase is measured. In a method in which a defect in the electric motor is identified reliably, the three motor phases are energized one after the other and the current occurring during this energization of the individual motor phases is measured, wherein the currents measured in the three motor phases are compared with one another and a defect in the electric motor is identified if the measured currents differ from one another.

6 Claims, 3 Drawing Sheets

(56) References Cited

U.S. PATENT DOCUMENTS

| | | | |
|---|---|---|---|
| 6,064,172 A | 5/2000 | Kuznetsov | |
| 7,528,611 B2* | 5/2009 | Kasztenny | H02H 1/0092 324/509 |
| 2007/0290690 A1* | 12/2007 | Nasswetter | G01R 31/025 324/511 |
| 2009/0033357 A1* | 2/2009 | Lindsey | G01R 31/346 324/765.01 |
| 2010/0060289 A1* | 3/2010 | Wiedenbrug | G01R 31/04 324/511 |
| 2010/0091419 A1* | 4/2010 | Vedula | H02H 3/353 361/47 |
| 2010/0327791 A1* | 12/2010 | Casey | H02K 16/00 318/452 |
| 2011/0187304 A1 | 8/2011 | Anwar et al. | |
| 2012/0032683 A1 | 2/2012 | Greif et al. | |
| 2012/0074953 A1* | 3/2012 | Stickelmann | G01R 19/16538 324/537 |
| 2012/0212172 A1* | 8/2012 | Valdez | G01R 31/025 318/805 |
| 2013/0041554 A1* | 2/2013 | Trunk | B60L 3/0061 701/34.1 |
| 2013/0245614 A1* | 9/2013 | Seebruch | A61M 1/1086 604/891.1 |
| 2013/0278282 A1* | 10/2013 | Leppich | G01R 31/343 324/765.01 |

FOREIGN PATENT DOCUMENTS

| | | |
|---|---|---|
| JP | 2011083396 | 4/2011 |
| WO | 2011009751 | 1/2011 |

* cited by examiner

METHOD FOR DETERMINING A FAULT IN AN ELECTRONICALLY COMMUTATED ELECTRIC MOTOR

BACKGROUND

The invention relates to a method for determining a fault in an electronically commutated electric motor, in which in every motor phase at least one stator coil of the electric motor is connected in parallel, with a motor phase being energized, and the current flowing through this motor phase being measured.

A method for checking the phases of an electronically commutated electric motor is known from DE 10 2011 083 217 A1. In this electric motor to be checked the respectively two coils arranged in each motor phase of the electric motor are connected serially. In order to reliably detect any phase interruption, successively at least two commutation steps of the electric motor are initiated, and a current measurement is performed in each commutation step. If here in one motor phase a power outage is detected, an interruption of the motor phase is concluded.

However, there are also electric motors in which the two coils are connected in parallel in the respective motor phase. Here, in case of a fault of such a coil connected in parallel a current flow still occurs. The electric motor still runs thereby, however with reduced capacity. If this defective electric motor is operated like a functioning one, severe consequential damages may arise in the electric motor.

SUMMARY

The invention is therefore based on the objective of providing a method for the determination of a fault in an electronically commutated electric motor, in which in every motor phase two stator coils of the motor are connected in parallel, in which a defect in a motor phase is detected reliably, although the motor continues operating.

According to the invention the objective is attained such that the three motor phases are energized successively and during this electrification the current flowing is measured in the respective motor phase, with here the currents measured in the three motor phases being compared and any fault in the electric motor being detected when the currents measured differ from each other. The deviation of the currents may here be positive or negative, depending on the connection. However, it can always be reliably concluded that a motor phase, i.e. particularly one of the coils connected in parallel in the respective motor phase, is defective. By measuring the three motor phases directly one after the other, here any environmental influences can be eliminated and the relatively high differences in the currents can be detected directly.

Advantageously, in case of a deviation of a first current of the two currents, measured in the first motor phase, from the other two motor phases measured, a defect of a coil in the first motor phase can be concluded. In case of a defective coil in a parallel connection, relatively large differences occur in the currents. However, it must be distinguished between a delta connection and a star connection.

In one embodiment, in a delta connection of the three motor phases, the motor phase is detected as defective in which the current measured directly over the motor phase is lower than the current which is measured jointly over the two other motor phases connected serially. This is caused in that in a delta connection, the terminal resistance is calculated from the value of all three motor phases. This way, the terminal resistance changes in all current conditions.

In one alternative, in a star connection of the three motor phases, the motor phase is detected as non-defective in which the current measured is higher than the current measured separately in the two other motor phases. Here, the terminal resistance is equivalent to two phases connected serially, causing the current flowing through a phase with a defective coil, to behave differently than the current flowing through the two remaining phases with correctly operating coils.

In one variant the three motor phases have the same voltage applied for current measurements. This is particularly important because for the current measurement the same initial conditions must be given at the three motor phases of the electric motor, in order to allow comparing the currents measured.

In a further development the electric motor is switched to emergency operation after a fault has been detected. By such an emergency operation any further damage of the electric motor can be reliable prevented, for example overheating.

In one embodiment, a control device is used for the current measurement, which performs the check of the motor phases in a diagnostic mode. Advantageously it represents the same control device which is provided to control the electric motor. In the control device itself, here a measuring resistor is installed, which is used for the current measurement at the individual motor phases. This way, the suggested method represents a particularly cost-effective method to allow detecting defects in the electrically commutated electric motor.

BRIEF DESCRIPTION OF THE DRAWINGS

The invention allows numerous embodiments, one of which shall be explained in greater detail using the figures shown in the drawing.

Shown are.

Identical features are marked with the same reference characters.

DETAILED DESCRIPTION OF THE PREFERRED EMBODIMENTS

Figure 1:
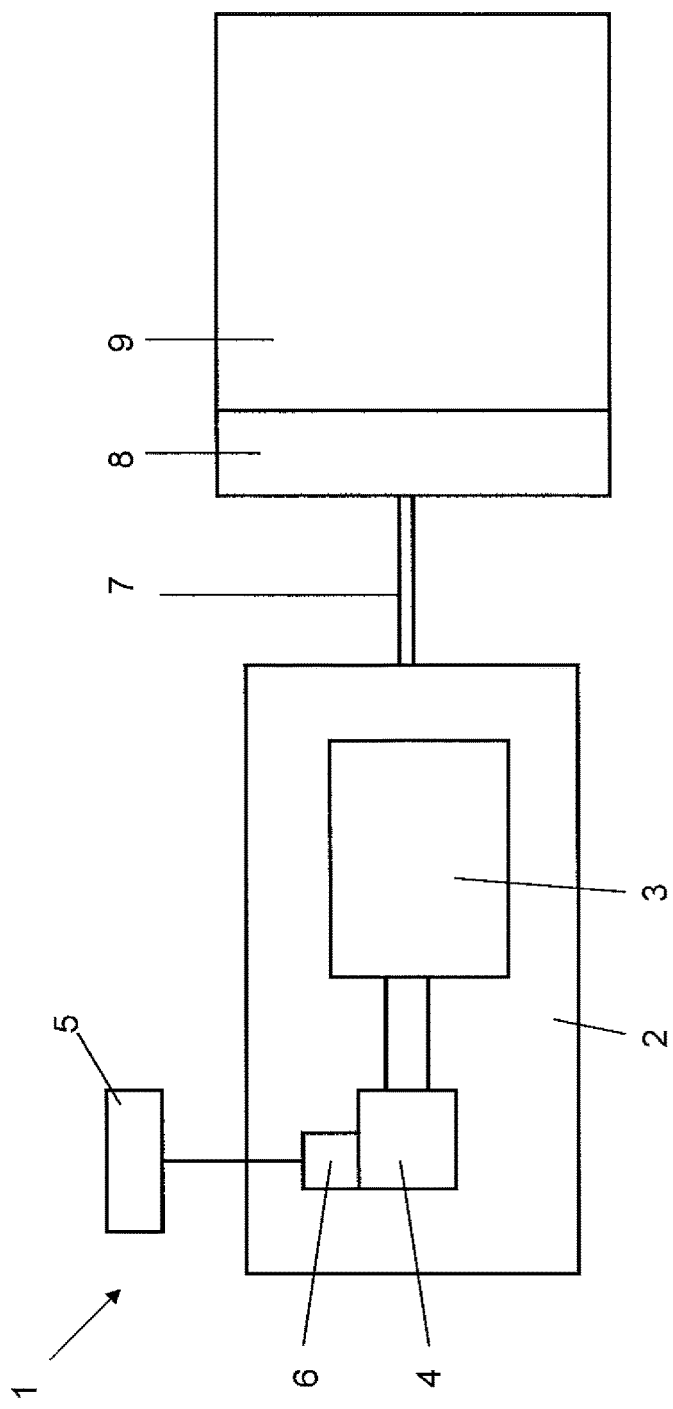
FIG. 1: an illustration of the principle of an electrohydraulic clutch system.

FIG. 1 shows an electrohydraulic clutch system as presently used in motor vehicles. Such a clutch system exhibits a hydrostatic actuator 1 as known for example from DE 10 2010 047 801 A1. This hydrostatic actuator 1 comprises an actuator housing 2, in which a piston 3 is arranged in an articulate fashion. The piston 3 is driven by an electrically commutated electric motor 4, which is addressed by a control device 5 via an end stage 6. The end stage 6 is here arranged in the actuator housing 2.

The hydrostatic actuator 1 is connected via a hydraulic line 7 to the slave cylinder 8, which moves a clutch 9. The adjustment of the position of the clutch 9 occurs based on the drive of the piston 3, arranged in a master cylinder, not shown in greater detail, by the electric motor 4 in the hydrostatic actuator 1.

Figure 2:
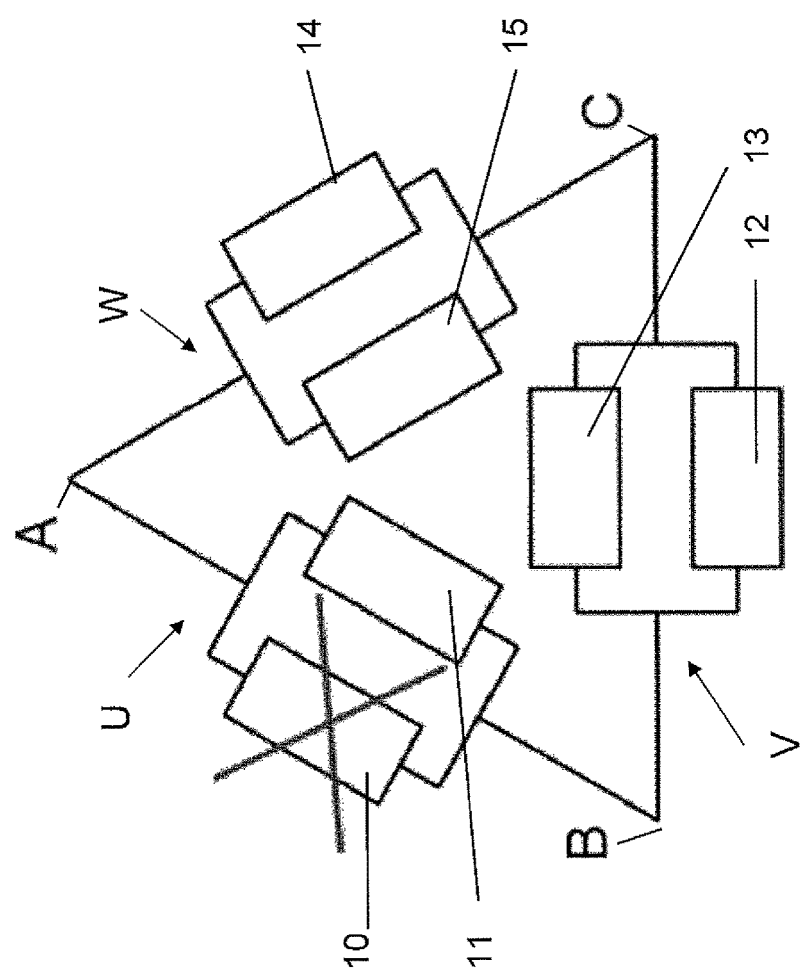
FIG. 2: an exemplary embodiment for a delta connection of the motor phases of the electric motor.

During operation of the clutch 9 the electric motor 4 is addressed by a control device 5 in a commutation mode, with the electric motor 4 having three phases U; V; W. FIG. 2 shows as an example a delta connection of the motor phases U, V, W of the electric motor 4. Every motor phase U, V, W includes here two stator coils 10, 11; 12, 13; 14, 15 of the electric motor 4, connected to each other in parallel. The coils 10, 11; 12, 13; 14, 15 are here identical and have the same resistance $R_{sp}$. The resistance of the phase changes depending on the fact of a motor phase U, V, W including a defective or normally functioning coil 10, 11; 12, 13; 14, 15.

The resistance of a defective phase $R_{phase,def}$ amounts to $$R_{phase,def} = R_{sp}$$

The resistance of the normal phase $R_{phase}$ amounts to $$R_{phase} = \tfrac{1}{2} R_{sp}.$$

At a current measurement, a terminal resistance $R_{total,1}$ acts, for example, between the terminals A and B amounting to $$R_{total,1} = \frac{1}{\dfrac{1}{R_{Phase,def}} + \dfrac{1}{2R_{Phase}}} = \frac{1}{2} R_{sp}.$$

The terminal resistance $R_{total,2}$, which is yielded in a current measurement between the terminals A, C or B, C, amounts to $$R_{total,2} = \frac{1}{\dfrac{1}{R_{Phase}} + \dfrac{1}{R_{Phase} + R_{Phase,def}}} = \frac{3}{8} R_{sp}.$$

The current $I_{conductor,1}$ flowing between the terminals A and B, measured according to the ohmic resistance, amounts to $$I_{conductor,1} = \frac{U}{R\,\text{total, 1}} = \frac{U}{\tfrac{1}{2} R_{Sp}} = 2 I_0.$$

The current $I_{conductor,2}$, which is measured between the terminals A and B, but detected via the two motor phases V (terminal B and C) and W (terminal C and A), amounts to:

$$I_{conductor,2} = \frac{U}{R\,\text{total, 2}} = \frac{U}{\tfrac{3}{8} R_{Sp}} = \frac{8}{3} I_0.$$

The deviation of the current $I_{conductor,1}$, which flows through the motor phase U, in which the defective coil 10 is located, amounts to $$\frac{I_{conductor,2}}{I_{conductor,1}} = \frac{4}{3}.$$

If the defective coil 10 is located directly between the terminals A, B subject to identical voltage, the resistance increases by the factor of 3/2; in the two other cases by a factor of 9/8. If now one by one the three phases are energized, when the defective coil 10 is located directly between the terminals A, B, the current is lower by ¼ than in the other two cases, in which the two other motor phases V, W are measured.

Figure 3:
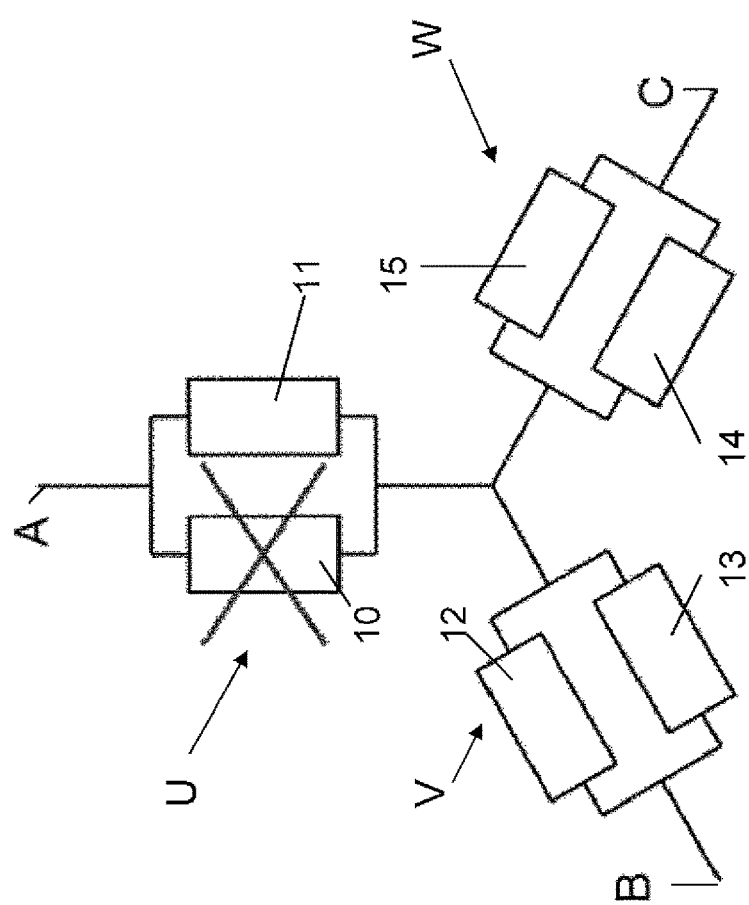
FIG. 3: an exemplary embodiment for a star connection of the motor phases of the electric motor.

In a star connection as shown in FIG. 3 the terminal resistance $R_{total}$ between the terminal points A, B, C is equivalent to two motor phases U, V, W connected serially. If now one of the two coils 10, 11 connected parallel in one of the motor phases U, V, W is defective, the terminal resistance $R_{total}$ increases by a factor of 3/2. The current $I_{conductor,1}$ measured in the motor phase U therefore reduces in an unchanged control voltage to ⅔ of the current $I_{conductor,2}$ in the normal state. When now one after the other the three motor phases U, V, W are energized, in electrification without a defective coil the current $I_{conductor,1}$ is higher by 50% than when the defective motor phase U is energized, compared to the other two motor phases V, W.

In a star connection it also applies that the resistance of the defective phase $R_{phase,def}$ $$R_{phase,def} = R_{sp}.$$

The resistance of the normal phase $R_{phase}$ amounts to $$R_{phase} = \tfrac{1}{2} R_{sp}.$$

The terminal resistance $R_{total}$ between the terminal points B and C amounts here to $$R_{total} = 2 * R_{phase} = R_{sp}.$$

The terminal resistance $R_{total}$, which is measured between the terminal points A, B and A, C, with one connection in parallel respectively comprising a defective coil 10, amounts to $$R_{total,2} = R_{phase} = R_{phase,def} = 3/2 R_{sp}.$$

The current $I_{conductor,1}$, which is measured between the normal motor phase V and the terminal points B and C, amounts to $$I_{conductor,1} = \frac{U}{R\,\text{total}} - \frac{U}{R\,sp} = I_0.$$

The current measured at the defective coil phases between the terminals A, B and A, C amounts to $$I_{conductor,2} = \frac{U}{R\,\text{total, 2}} = \frac{U}{\tfrac{3}{2} R_{Sp}} = \frac{2}{3} I_0.$$

Here, the deviation of the currents amounts to $$\frac{I_{conductor,1}}{I_{conductor,2}} = \frac{3}{2}.$$

With this method, even in electronically commutated electric motors showing two stator coils in each motor phase connected in parallel, it can be detected if the electric motor operates correctly.

LIST OF REFERENCE CHARACTERS 1 hydrostatic actuator
2 actuator housing
3 piston
4 electric motor 5 control device
6 end stage
7 hydraulic line
8 slave cylinder
9 clutch
10 coil
11 coil
12 coil
13 coil
14 coil
A terminal point
B terminal point
C terminal point
U motor phase
V motor phase
W motor phase

The invention claimed is:

1. A method for determining a fault in an electronically commutated electric motor, in which in every motor phase (U, V, W) at least one stator coil of the electric motor is connected in parallel, the method comprising:
   energizing each one of the motor phases (U, V, W) successively, including applying a voltage to each of the motor phases (U, V, W),
   measuring a current value flowing through the motor phases (U, V, W), during electrification of the individual motor phases (U, V, W), the current value being an amount of current at the applied voltage,
   comparing the measured values of the currents flowing in the three motor phases (U, V, W) to each other,
   detecting a defect of the electric motor when the values of the currents measured at the applied voltage differ from each other,
   further comprising in case of a deviation of a first current, measured in a first motor phase (U) of the motor phases, from the two currents which were measured in the two other motor phases (V, W), concluding that there is a defect of the coil in the first motor phase (U),
   for a delta connection of the three motor phases (U, V, W), detecting that one of the motor phases (U) is non-defective when the current directly measured over the motor phase (U) is lower by ¼ than the current which is measured over two motor phases (V, W) connected serially, and
   upon detection of the defect, switching the electric motor into an emergency operating mode.

2. The method according to claim 1, wherein the three motor phases (U, V, W) have identical voltages applied for the current measurement.

3. The method according to claim 1, further comprising providing a control device adapted to control the motor, the control device including a measuring resistor, and
   using the control device and the measuring resistor for measuring the currents, which performs a check of the motor phases (U, V, W) in a diagnostic mode.

4. A method for determining a fault in an electronically commutated electric motor, in which in every motor phase (U, V, W) at least one stator coil of the electric motor is connected in parallel, the method comprising:
   energizing each one of the motor phases (U, V, W) successively, including applying a voltage to each of the motor phases (U, V, W),
   measuring a current value flowing through the motor phases (U, V, W), during electrification of the individual motor phases (U, V, W), the current value being an amount of current at the applied voltage,
   comparing the measured values of the currents flowing in the three motor phases (U, V, W) to each other,
   detecting a defect of the electric motor when the values of the currents measured at the applied voltage differ from each other,
   further comprising in case of a deviation of a first current, measured in a first motor phase (U) of the motor phases, from the two currents which were measured in the two other motor phases (V, W), concluding that there is a defect of the coil in the first motor phase (U),
   for a star connection of the three motor phases (U, V, W), detecting that one of the motor phases (U) is defective, when the current measured is higher by 50% than the current measured separately in the two other motor phases (V, W), and
   upon detection of the defect, switching the electric motor into an emergency operating mode.

5. The method according to claim 4, wherein the three motor phases (U, V, W) have identical voltages applied for the current measurement.

6. The method according to claim 4, further comprising providing a control device adapted to control the motor, the control device including a measuring resistor, and
   using the control device and the measuring resistor for measuring the currents, which performs a check of the motor phases (U, V, W) in a diagnostic mode.

* * * * *